United States Patent
Beam, III et al.

[11] Patent Number: 5,935,641
[45] Date of Patent: Aug. 10, 1999

[54] METHOD OF FORMING A PIEZOELECTRIC LAYER WITH IMPROVED TEXTURE

[75] Inventors: Edward A. Beam, III, Dallas; Andrew J. Purdes, Garland, both of Tex.

[73] Assignee: Texas Instruments Incorporated, Dallas, Tex.

[21] Appl. No.: 08/946,631

[22] Filed: Oct. 7, 1997

Related U.S. Application Data

[60] Provisional application No. 60/028,989, Oct. 23, 1996.

[51] Int. Cl.[6] .............................. C23C 16/34; C23C 14/08
[52] U.S. Cl. .............. 427/100; 427/255.19; 427/255.31; 427/255.34; 427/255.394; 427/255.7; 427/576; 204/192.18; 204/192.22
[58] Field of Search ..................................... 427/100, 255, 427/255.3, 255.7, 574, 576, 579, 255.19; 204/192.18, 192.22, 192.23

[56] References Cited

U.S. PATENT DOCUMENTS

| | | | |
|---|---|---|---|
| 3,615,264 | 10/1971 | Berry et al. ........................... | 23/301 R |
| 4,428,808 | 1/1984 | Weinert et al. ......................... | 427/100 |
| 5,146,299 | 9/1992 | Lampe et al. .......................... | 357/23.5 |
| 5,340,799 | 8/1994 | Tauber et al. .......................... | 505/237 |
| 5,479,875 | 1/1996 | Tachibana et al. ...................... | 427/517 |
| 5,567,979 | 10/1996 | Nashimoto et al. ..................... | 257/627 |
| 5,698,928 | 12/1997 | Mang et al. ............................ | 310/322 |
| 5,712,001 | 1/1998 | Fujii et al. .............................. | 427/576 |

OTHER PUBLICATIONS

Buchanon, Relva C., "Ceramic Materials for Electronics"; Marcel Dekker, Inc, New York, 1986, p. 141.

*Primary Examiner*—Shrive Beck
*Assistant Examiner*—Bret Chen
*Attorney, Agent, or Firm*—Mark A. Valetti; Carlton H. Hoel; Richard L. Donaldson

[57] ABSTRACT

A method is provided for forming a piezoelectric layer with improved texture. In the method, a seed material is deposited on a substrate (12) at a low deposition rate to form a seed layer (16). The low deposition rate may be a rate in the range of 10.0–150 nanometers per hour. A piezoelectric material is deposited on the seed layer at a high deposition rate to form a bulk piezoelectric layer (20) having improved texture. The high deposition rate can be a rate in the range of 500–5000 nanometers per hour.

19 Claims, 1 Drawing Sheet

5,935,641

METHOD OF FORMING A PIEZOELECTRIC LAYER WITH IMPROVED TEXTURE

This application claims priority under 35 USC § 119(e)(1) of provisional application Ser. No. 60/028,989, filed Oct. 23, 1996.

RELATED PATENT APPLICATION

This application is related to copending U.S. Provisional Application Ser. No. 60/028,989 Attorney's Docket No. TI-20209P, filed on Oct. 23, 1996 by Edward A. Beam III, et al. and entitled "Forming a Piezoelectric Layer With Improved Texture."

TECHNICAL FIELD OF THE INVENTION

This invention relates generally to the field of electronic device fabrication, and more particularly, to a method of forming a piezoelectriclayer with improved texture.

BACKGROUND OF THE INVENTION

Piezoelectric materials, such as aluminum nitride and zinc oxide, can be formed as layers on a substrate structure. These piezoelectric layers may be incorporated into electronic applications, such as thin film resonator filters. In order for such resonator filters to function properly, the piezoelectric layers must possess a strong C-axis or (001) polycrystalline orientation or "texture" normal to a substrate plane. From a manufacturing standpoint it is desirable to form such piezoelectric layers using high deposition rate processes at low temperature (i.e., less than 300° C.). Previously, conventional sputtering techniques were used to form piezoelectric layers. According to such techniques, piezoelectric material was typically deposited at a low deposition rate upon a substrate. Conventional sputtering techniques, however, have limited process space, thus resulting in piezoelectric layers having poor (001) polycrystalline texture when deposited at high deposition rates.

More recently, conventional chemical vapor deposition and plasma-assisted ultra high vacuum chemical vapor deposition techniques have been utilized to form piezoelectric layers. Conventional chemical vapor deposition techniques are known to one of ordinary skill in the art. Plasma-assisted ultra high vacuum chemical vapor deposition is a variant of conventional chemical vapor deposition in which deposition occurs at very low pressures. The low deposition pressures promote molecular flow conditions in a reactor so that chemical reactions occur directly on a substrate surface, not in a gas phase. A variety of source material constituents, such as gases ororganometallic vapors, can be used in a plasma-assisted ultra high vacuum chemical vapor deposition technique. These source material constituents can be subjected to various processes, such as direct injection, evaporation, and plasma or thermal decomposition or "precracking." Like the conventional sputtering techniques, however, the conventional chemical vapor deposition and plasma-assisted ultra high vacuum techniques produced piezoelectric layers with poor (001) texture at high deposition rates.

SUMMARY OF THE INVENTION

In accordance with the present invention, the disadvantages and problems associated with previous techniques for forming piezoelectric layers have been substantially reduced or eliminated.

According to an embodiment of the present invention, a method is provided for forming a piezoelectric layer with improved texture. In the method, a seed material is deposited on a substrate at a low deposition rate to form a seed layer. The low deposition rate may be a rate in the range of 10.0–150 nanometers per hour. A piezoelectric material is deposited on the seed layer at a high deposition rate to form a bulk piezoelectric layer having improved texture. The high deposition rate can be a rate in the range of 500–5000 nanometers per hour.

According to another embodiment of the present invention, a method is provided for forming a piezoelectric layer with improved texture. In the method, an insulating material, a conducting material, or a combination thereof, is deposited on a substrate to form at least one intermediate layer. A seed material is deposited on the intermediate layer at a low deposition rate to form a seed layer. A piezoelectric material is then deposited on the seed layer at a high deposition rate to form a bulk piezoelectric layer having improved texture.

The present invention provides various technical advantages over prior techniques for forming a piezoelectric layer. One technical advantage includes forming a seed layer of piezoelectric material at a low deposition rate, such as a rate in the range of 10.0–150 nanometers per hour, and at a low temperature, such as in the range of 25–300° C. Such seed layer will have a good (001) texture. A bulk layer of piezoelectric material may then be formed on the seed layer at a high deposition rate, such as a rate in the range of 500–5000 nanometers per hour, and at a low temperature, such as in the range of 25–300° C. This bulk piezoelectric layer will have a good (001) texture since the seed layer has good texture. Other technical advantages are readily apparent to one skilled in the art from the following figures, description, and claims.

BRIEF DESCRIPTION OF THE DRAWINGS

For a more complete understanding of the present invention. and the advantages thereof, reference is now made to the following description taken in conjunction with the accompanying drawings, wherein like reference numerals represent like parts, in which.

DETAILED DESCRIPTION OF THE INVENTION

The preferred embodiment of the present invention and its advantages are best understood by referring to FIGS. 1A–1C and 2A–2D of the drawings, like numerals being used for like and corresponding parts of the various drawings.

Figure 1A:
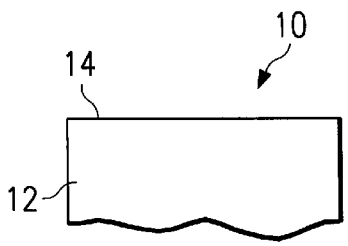
FIGS. 1A, 1B, and 1C are sectional views illustrating a method of forming a piezoelectric layer with improved texture in a semiconductor device according to one embodiment of the present invention.
Figure 1B:
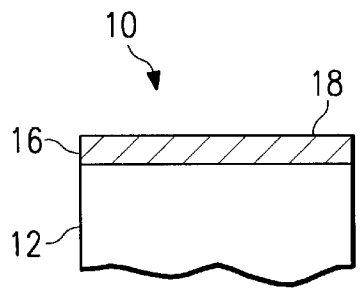
Figure 1C:
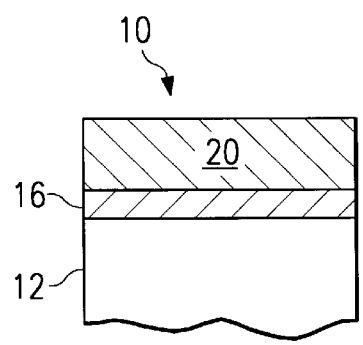

FIGS. 1A–1C are sectional views illustrating a method of forming a piezoelectric layer with improved texture in a semiconductor device 10, according to one embodiment of the present invention. Referring to FIG. 1A, device 10 includes a substrate 12, which can be part of a production wafer. Substrate 12 may be a polymer or organic substrate, or formed from silicon, galliumarsenide, sapphire, or any other suitable inorganic substrate material. Substrate 12 can have an amorphous structure, or alternatively, a single crystalline or a polycrystalline orientation or texture. Substrate 12 has a surface 14.

Referring to 1B, a seed layer 16 is formed on surface 14 of substrate 12. Seed layer 16 may comprise a piezoelectric material, such as aluminum nitride or zinc oxide. Alternatively, seed layer 16 may be formed from a suitable metal or metallic compound. Seed layer 16 has a surface 18. Seed layer 16 may be deposited at a low deposition rate by a sputter deposition technique, a conventional chemical vapor deposition technique, or other suitable deposition technique. The plasma-enhanced ultra high vacuum chemical vapor deposition technique enables a high degree of control of the growth environment for the seed layer 16, which is not available in other techniques. The low deposition rate may be in the range of 10.0–150 nanometers per hour. This deposition at a low rate may occur in a temperature range of 25–300° C. The low growth rate deposition may occur for a period of five minutes, resulting in seed layer 16 having a thickness of up to 12.5 nanometers. The process described above produces a seed layer 16 having good (001) texture. Seed layer 16 functions as a pre-layer or seed layer for subsequent layers of material.

Referring to FIG. 1C, a bulk layer 20 of piezoelectric material, such as aluminum nitride or zinc oxide, may be formed on surface 18 of seed layer 16. The material from which bulk layer 20 is formed may be the same or different from the material from which seed layer 16 is formed. Bulk layer 20 may have a thickness of in the range of 500–5000 nanometers. In contrast to seed layer 16, bulk layer 20 is deposited at a high deposition rate, which may be in the range of 500–5000 nanometers per hour. A sputter deposition technique, a conventional chemical vapor deposition technique, or a plasma-enhanced ultra high vacuum chemical vapor deposition technique may be used for this high growth rate deposition. Deposition may occur at a temperature in the range of 25–300° C. Because bulk layer 20 is formed on or "grown" from seed layer 16, bulk layer 20 will have good (001) texture as compared to a piezoelectric layer deposited at a high deposition rate directly upon a substrate. Accordingly a piezoelectric layer 20 having improved (001) texture is produced by the present invention.

Figure 2A:
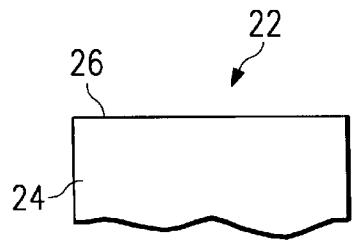
FIGS. 2A, 2B, 2C, and 2D are sectional views illustrating a method of forming a piezoelectric layer with improved texture in a semiconductor device, according to another embodiment of the present invention.

FIGS. 2A–2D are sectional views illustrating a method forming a piezoelectric layer with improved texture in a semiconductor device 22, according to another embodiment of the present invention. Referring to FIG. 2A, device 22 includes a substrate 24. Substrate 24 may be formed from any suitable substrate material, such as silicon, galliumarsenide, or sapphire. Substrate 24 has a surface 26. Substrate 24 shown in FIG. 2A may be substantially similar to substrate 14 illustrated and described with reference to FIG. 1A.

Figure 2B:
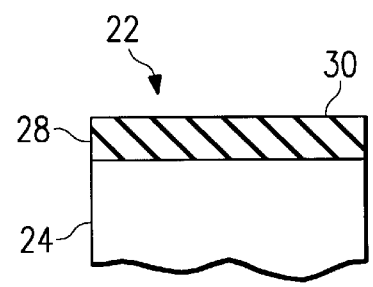

Referring to FIG. 2B, an intermediate layer 28 is formed on surface 26 of substrate 24. Intermediate layer 28 may comprise silicon dioxide or similar insulating material. As such, intermediate layer 28 functions to electrically isolate various layers or elements. An insulating layer may have a thickness of approximately 2000 angstroms.

Alternatively, intermediate layer 28 may be formed as a metal film, which comprises aluminum, gold, or another suitable conducting metal. In this case, intermediate layer 28 functions to electrically connect various layers or elements. A conducting layer may have a thickness of approximately 1000 angstroms. Intermediate layer 28 may have a surface 30. Intermediate layer 28 may be formed using any of a number of known techniques for depositing an insulating or conducting layer upon a substrate surface. Alternatively, several intermediate layers may be formed, these layers comprising insulating and/or conducting materials.

Figure 2C:
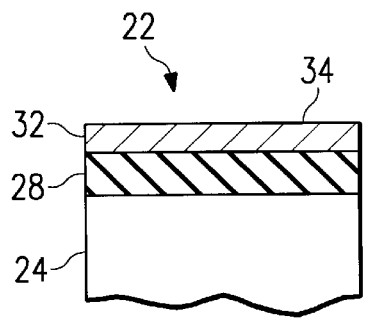

Referring to FIG. 2C, a seed layer 32 may be formed on surface 30 of intermediate layer 28. Seed layer 32 may comprise a piezoelectric material, such as aluminum nitride or zinc oxide. Alternatively, seed layer 32 may comprise a suitable metal or metallic compound. Seed layer 32 may have a surface 34. The fornation and properties of seed layer 32 may be substantially similar to the formation and properties of seed layer 16 described above with reference to FIG. 1B. The formation produces a seed layer 32 having a good (001) texture.

Figure 2D:
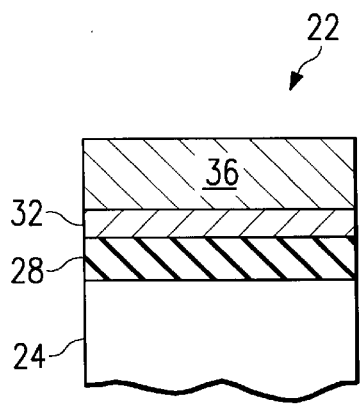

Referring to FIG. 2D, a bulk layer 36 of piezoelectric material is formed on surface 34 of seed layer 32. The properties and formation of bulk layer 36 can be substantially similar to the properties and formation of piezoelectric layer 20 described above with reference to FIG. 1C. Bulk layer 36 has good (001) texture since it is grown on seed layer 32.

Thus, as described above, the present invention produces piezoelectric layers having improved texture relative to piezoelectric layers formed according to previous techniques at high deposition rates. In fact, the texture of piezoelectric layers formed according to the present invention (e.g., bulk piezoelectric layers 20 and 36) may have (002) x-ray diffraction peak intensities which are several magnitudes of order higher than the (002) x-ray diffraction peak intensities of piezoelectric layers formed according to previous techniques. This indicates that piezoelectric layers of the present invention have a much higher degree of C-axis orientation texture normal to a substrate surface. Accordingly, the piezoelectric layers of the present invention are more useful in such electronic applications as thin film resonator filters.

Although the present invention and its advantages have been described in detail, it should be understood that various changes, substitutions, and alterations can be made herein without departing from the spirit and scope of the invention, as defined by the appended claims.

What is claimed is:

1. A method of forming a piezoelectric layer with improved texture, comprising the steps of:
    depositing seed material on a substrate at a first deposition rate to form a seed layer; and
    depositing piezoelectric material on the seed layer at a second deposition rate to form a bulk piezoelectric layer, said piezoelectric material is comprised of aluminum nitride or zinc oxide.

2. The method of claim 1, wherein the steps of depositing seed material and depositing piezoelectric material each comprise the step of depositing using a technique selected from the group consisting of a sputter deposition technique, a chemical vapor deposition technique, and a plasma enhanced chemical vapor deposition technique.

3. The method of claim 1, wherein the seed material comprises a piezoelectric material.

4. The method of claim 1, wherein the seed material comprises a metal or metallic compound.

5. The method of claim 1, wherein the step of depositing seed material comprises the step of depositing at a temperature in the range of 25–300° C.

6. The method of claim 1, whereinthe step of depositing piezoelectric material comprises the step of depositing at a temperature in the range of 25–300° C.

7. The method of claim 1, wherein the first deposition rate is a rate in the range of 10.0–150 nanometers per hour.

8. The method of claim 1, wherein the second deposition rate is a rate in the range of 500–5000 nanometers per hour.

9. The method of claim 1, further comprising the step of depositing a layer of insulating material on the substrate prior to the step of depositing seed material.

10. The method of claim 1, further comprising the step of depositing a layer of conducting material on the substrate prior to the step of depositing seed material.

11. A method of forming a piezoelectric layer with improved texture, comprising the steps of:

depositing seed material on a substrate at a deposition rate in the range of 10.0–150 nanometers per hour to form a seed layer; and depositing a piezoelectric material on the seed layer at a deposition rate in the range of 500–5000 nanometers per hour to form a bulk piezoelectric layer, said piezoelectric material is comprised of aluminum nitride or zinc oxide.

12. The method of claim 11, wherein the steps of depositing seed material and depositing a piezoelectric material each comprise the step of depositing using a technique selected from the group comprising a sputter deposition technique, a conventional chemical vapor deposition technique, and a plasma enhanced ultra high vacuum chemical vapor deposition technique.

13. The method of claim 11, wherein the seed material comprises a piezoelectric material.

14. The method of claim 11, wherein the seed material comprises a metal or metallic compound.

15. The method of claim 11, wherein the step of depositing seed material comprises the step of depositing at a temperature in the range of 25–300° C.

16. The method of claim 11, wherein the step of depositing piezoelectric material comprises the step of depositing at a temperature in the range of 25–300° C.

17. A method of forming a piezoelectric layer with improved texture, comprising the steps of:

depositing an insulating material, a conducting material, or a combination thereof, on a substrate to form at least one intermediate layer;

depositing seed material on the intermediate layer at a low deposition rate to form a seed layer; and depositing piezoelectric material on the seed layer at a high deposition rate to form a bulk piezoelectric layer, said piezoelectric material is comprised of aluminium nitride or zinc oxide.

18. The method of claim 17, wherein the first deposition rate comprises a rate in the range of 10.0–150 nanometers per hour.

19. The method of claim 17, wherein the second deposition rate comprises a rate in the range of 500–5000 nanometers per hour.

* * * * *